(12) United States Patent
Kuehlwein et al.

(10) Patent No.: US 7,671,667 B2
(45) Date of Patent: Mar. 2, 2010

(54) RAPIDLY ACTIVATED CURRENT MIRROR SYSTEM

(75) Inventors: Jeremy Kuehlwein, Woodbury, MN (US); Marius Dina, Inver Grove Heights, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/967,480

(22) Filed: Dec. 31, 2007

(65) Prior Publication Data

US 2009/0140797 A1    Jun. 4, 2009

Related U.S. Application Data

(60) Provisional application No. 60/913,154, filed on Apr. 20, 2007.

(51) Int. Cl.
    G05F 1/10    (2006.01)
(52) U.S. Cl. ....................................................... 327/538
(58) Field of Classification Search ................. 323/315; 327/535, 537, 538, 543
    See application file for complete search history.

(56) References Cited

U.S. PATENT DOCUMENTS

| | | | |
|---|---|---|---|
| 5,293,112 A * | 3/1994 | Takahashi | 323/315 |
| 6,016,050 A * | 1/2000 | Brokaw | 323/315 |
| 6,194,955 B1 * | 2/2001 | Ishida | 327/538 |
| 6,337,596 B1 * | 1/2002 | Shimozono | 327/538 |
| 6,456,142 B1 | 9/2002 | Gilbert | |
| 6,466,080 B2 * | 10/2002 | Kawai et al. | 327/538 |
| 6,496,317 B2 | 12/2002 | Lacombe | |
| 6,980,052 B1 | 12/2005 | Stroet | |
| 7,019,508 B2 * | 3/2006 | Rategh et al. | 323/314 |
| 7,075,358 B1 * | 7/2006 | Voo | 327/538 |
| 7,205,826 B2 * | 4/2007 | Kim et al. | 327/538 |
| 7,436,248 B2 * | 10/2008 | Furuichi | 327/543 |
| 7,463,013 B2 * | 12/2008 | Plojhar | 323/315 |

* cited by examiner

*Primary Examiner*—Jeffrey S Zweizig
(74) *Attorney, Agent, or Firm*—Dawn V. Stephens; Wade James Brady, III; Frederick J. Telecky, Jr.

(57) ABSTRACT

One embodiment of the invention includes a current mirror system. The system comprises a master circuit configured to conduct a first current in response to an activation state of an activation signal. The system also comprises a slave circuit configured to generate at least one second additional current in response to the activation state of the activation signal. Each of the at least one additional current can be proportional to the first current. The system further comprises a current path circuit that is configured as a substantial copy of the master circuit, the current path circuit being configured to conduct the first current in response to a deactivation state of the activation signal.

20 Claims, 4 Drawing Sheets

RAPIDLY ACTIVATED CURRENT MIRROR SYSTEM

This patent application claims priority from U.S. Provisional Application No. 60/913,154, filed 20 Apr. 2007.

TECHNICAL FIELD

This invention relates to electronic circuits, and more specifically to a rapidly activated current mirror system.

BACKGROUND

A current mirror is an electronic circuit in which a current that is generated acts as a master current, such that one or more slave currents are provided that are each proportional to the master current. As an example, a current mirror can include a master transistor that forms a current path for the master current and one or more additional slave transistors that form respective current paths for the slave currents. To provide the slave currents at respective magnitudes that are proportional to the master current, the master transistor and the additional slave transistors can be biased by a common bias voltage. Variations in magnitude between the slave currents and the master current can result based on a mismatch in size between the master transistor and the one or more slave transistors. As a result of the versatility of providing one or more currents proportional to a predetermined current, current mirrors can be implemented in any of a variety of circuit applications.

FIG. 1 illustrates an example of a typical current mirror system 10. The current mirror system 10 can be implemented in any of a variety of applications to provide at least one slave current $I_S$ that is proportional to a master current $I_M$. The current mirror system 10 includes a master circuit 12. As an example, the master circuit 12 can include a transistor, such as a bipolar junction transistor (BJT), and a bias resistor that collectively provide a current path for the current $I_M$ between a positive rail voltage $V_{CC}$ and a negative rail voltage, demonstrated in the example of FIG. 1 as ground. The current $I_M$ can be generated from a current source 14, such that the current $I_M$ can be controlled to have a predetermined magnitude. In the example of FIG. 1, the current source 14 provides the current $I_M$ to ground, such that the BJT transistor in the master circuit 12 can be configured as a PNP-type BJT. However, it is to be understood that the example of FIG. 1 is not limited to the use of PNP-type BJTs, such that the current source 14 could be configured to draw the current $I_M$ from the positive rail voltage $V_{CC}$ to provide the current to a collector of an NPN-type BJT in the master circuit 12.

The current mirror system 10 also includes a slave circuit 16. Similar to the master circuit 12, the slave circuit 16 can likewise include one or more transistors, such as BJTs, and a respective one or more bias resistors that each collectively provide a current path for each of the respective slave currents $I_S$. Each of the slave currents $I_S$ can have a magnitude that is equal to the master current $I_M$, or can have a magnitude that is proportional to the master current $I_M$. It is to be understood that the proportionality of each of the slave currents $I_S$ relative to the master current $I_M$ can be separate with respect to each other, such that slave currents $I_S$ can have magnitudes that are not equal with respect to each other. As an example, similar to the master circuit 12, the BJT transistors of the slave circuit 16 can each be configured as PNP-type BJTs. As a result, the current paths of each of the slave currents $I_S$ can begin from the positive rail voltage $V_{CC}$, and each of the slave currents $I_S$ can be provided to any of a variety of loads.

To achieve the proportionality between the slave currents $I_S$ and the master current $I_M$, the BJTs of the master circuit 12 and the slave circuit 16 can have respective base terminals that are coupled together and are biased by a common bias voltage (e.g., approximately 0 volts). As such, the master circuit 12 can include one or more transistors that are configured to set the bias voltage for the respective master circuit 12 and slave circuit 16. Thus, in the example of FIG. 1, the base terminals of the respective BJTs of the master circuit 12 and the slave circuit 16 are coupled together, as demonstrated at 18.

As an example, the one or more transistors can include a beta helper transistor. Specifically, the beta helper transistor can be configured in a feedback arrangement with the transistor of the master circuit 12. For example, a collector of the transistor of the master circuit 12 can be coupled to a base of the beta helper transistor and an emitter of the beta helper transistor can be coupled to the base of the transistor of the master circuit 12 and the transistors of the slave circuit 16. As a result, the beta helper transistor can set a common bias voltage for the master circuit 12 and the slave circuit 16 for the generation of the slave currents $I_S$ proportional to the master current $I_M$.

In the example of FIG. 1, the current mirror system 10 also includes a compensation capacitor $C_{CMP}$. The compensation capacitor $C_{CMP}$ can be configured to stabilize the master current $I_M$, and thus the slave currents $I_S$. For example, transient effects on the master current $I_M$ can result in undesired oscillation of the master current $I_M$, and thus the slave currents $I_S$. As a result, the compensation capacitor $C_{CMP}$ is configured to substantially mitigate the transient effects and thus maintain the master current $I_M$ and respective slave currents $I_S$ as substantially constant based on an amount of charge stored therein.

In many applications of the current mirror system 10, it may be necessary to activate and deactivate the current mirror system 10. Specifically, it may be necessary to deactivate the supply of the slave currents $I_S$ to all of the respective loads to which they are provided. As a result, the current mirror system 10 can include a manner in which to activate and deactivate the current mirror system 10, such that the slave currents $I_S$ are respectively provided and deactivated (i.e., reduced to a magnitude of zero).

In the example of FIG. 1, the current mirror system 10 includes a switch circuit 20 that is arranged in parallel with the master circuit 12 and the compensation capacitor $C_{CMP}$. The switch circuit 20 can be configured to divert the master current $I_M$ from the master circuit 12 through the switch circuit 20 in response to an activation signal, thus preventing the master current $I_M$ from being mirrored through the slave circuit 16. However, such an arrangement typically changes a respective voltage across the compensation capacitor $C_{CMP}$, which may be required to hold a specific amount of charge to prevent unintended current flow through the master circuit 12 during deactivation of the current mirror system 10. As a result, upon activating the current mirror system 10, such that the master current $I_M$ is again provided through the master circuit 12, the compensation capacitor $C_{CMP}$ may need to build charge in response to the change in voltage across it. Accordingly, the slew resulting from the building of charge in activating the current mirror system 10 results in an increase of the time that it takes to activate the current mirror system 10.

A smaller compensation capacitor $C_{CMP}$ could be implemented in the current mirror system 10, such that the slew rate at activation of the current mirror system 10 can be mitigated. However, a smaller compensation capacitor $C_{CMP}$ is substantially less effective at stabilizing the master current $I_M$. Additional circuit devices could be included in the switch circuit 20 to increase a voltage-drop across the parallel path of the switch circuit 20. However, it may be very difficult to provide the correct voltage-drop magnitudes across the additional circuit devices to prevent slew of the compensation capacitor $C_{CMP}$, and additional devices can result in a larger physical size of the current mirror system 10.

Another example of a manner for activation and deactivation of the slave currents $I_S$ is described with reference to the example of FIG. 2. FIG. 2 illustrates another example of a typical current mirror system 30. In the example of FIG. 2, like reference numbers are used to demonstrate the components of the current mirror system 30 having substantially the same function as that described above with reference to the current mirror system 10 in the example of FIG. 1.

In the example of FIG. 2, the current mirror system 30 includes a switch circuit 32 that interconnects the master circuit 12 and the slave circuit 16. The switch circuit 32 is thus configured to connect and disconnect the slave circuit 16 from the master circuit 12. Specifically, one or more switches can decouple the bases of the transistors of the slave circuit 16 from the beta helper transistor in the master circuit 12 and instead couple the respective bases to an opposite bias voltage (e.g., the positive rail voltage $V_{CC}$). As a result, the bias voltage is removed from the slave circuit 16, resulting in the transistors within the slave circuit 16 being switched to a cutoff mode. However, the transistors that constitute the current paths in the slave circuit 16 may be sized large to provide large amounts of the slave current $I_S$. As a result, one or more of the transistors in the slave circuit 16 may include a significant amount of parasitic base capacitance from being coupled to the opposite bias voltage. As such, the activation time of the current mirror system 10 can be significantly increased for the slave currents $I_S$ based on an RC delay resulting from the base capacitance of the transistors of the slave circuit 16. Such a delay in activation time can be mitigated by including a large switch in the switch circuit 32 for disconnecting the bases of the slave transistors in the slave circuit 16. However, similar to as described above, a large switch can result in a larger physical size of the current mirror system 10. Furthermore, the slave currents $I_S$ can still have activation times that vary relative to each other.

SUMMARY

One embodiment of the invention includes a current mirror system. The system comprises a master circuit configured to conduct a first current in response to an activation state of an activation signal. The system also comprises a slave circuit configured to generate at least one second additional current in response to the activation state of the activation signal. Each of the at least one additional current can be proportional to the first current. The system further comprises a current path circuit that is configured as a substantial copy of the master circuit, the current path circuit being configured to conduct the first current in response to a deactivation state of the activation signal.

Another embodiment of the invention includes a method for activating a current mirror to generate at least one slave current that is proportional to a master current. The method comprises providing the master current through a current path circuit that is configured in parallel with a master circuit of the current mirror and a compensation capacitor. The method also comprises asserting an activation signal corresponding to activation of the current mirror and deactivating the master current through the current path circuit in response to the activation signal. The method also comprises providing the master current from the master circuit in response to the activation signal and maintaining a substantially constant charge on the compensation capacitor upon deactivating the master current through the current path circuit and providing the master current through the master circuit. The method further comprises providing the at least one slave current through a slave circuit of the current mirror in response to the activation signal.

Another embodiment of the invention includes a current mirror system. The system comprises means for setting a bias voltage and means for generating a master current in response to the bias voltage. The system also comprises means for generating at least one slave current in response to the bias voltage. Each of the at least one slave current can be proportional to the first current. The system also comprises capacitive means for stabilizing the master current and means for maintaining a substantially constant charge on the capacitive means for stabilizing in response to activation and deactivation of the current mirror system.

DETAILED DESCRIPTION

The invention relates to electronic circuits, and more specifically to a rapidly activated current mirror system. The current mirror system can include a master circuit and a master circuit copy that are each configured in parallel with a compensation capacitor. Each of the master circuit and the copy of the master circuit can include a switch circuit. The switch circuit can be configured to remove a bias voltage associated with both the master circuit and a slave circuit of the current mirror system in response to an activation signal. Specifically, the switch circuit can be configured to deactivate a beta helper transistor and to decouple the beta helper transistor from a feedback arrangement with a master transistor of the master circuit. As a result, neither the master transistor nor the slave transistors are biased, resulting in deactivation of the slave currents. Therefore, during deactivation of the current mirror system, base capacitance associated with the transistors of the slave circuit is not increased. Accordingly, the transistors of the slave circuit can be activated concurrently with substantially no RC delay.

The copy of the master circuit can be configured as an alternate current path for the master current upon deactivation of the current mirror system. The master circuit copy can be configured as a substantial copy of the master circuit, such as based on including electronic devices that are matched with respective electronic devices of the master circuit. As a result, a voltage across a compensation capacitor that is arranged in parallel with the master circuit and the master circuit copy can remain substantially constant during a transition between activation and deactivation of the current mirror system. Accordingly, upon activation of the current mirror system, there is substantially no activation delay resulting from a slew associated with the charging of the compensation capacitor.

Figure 1:
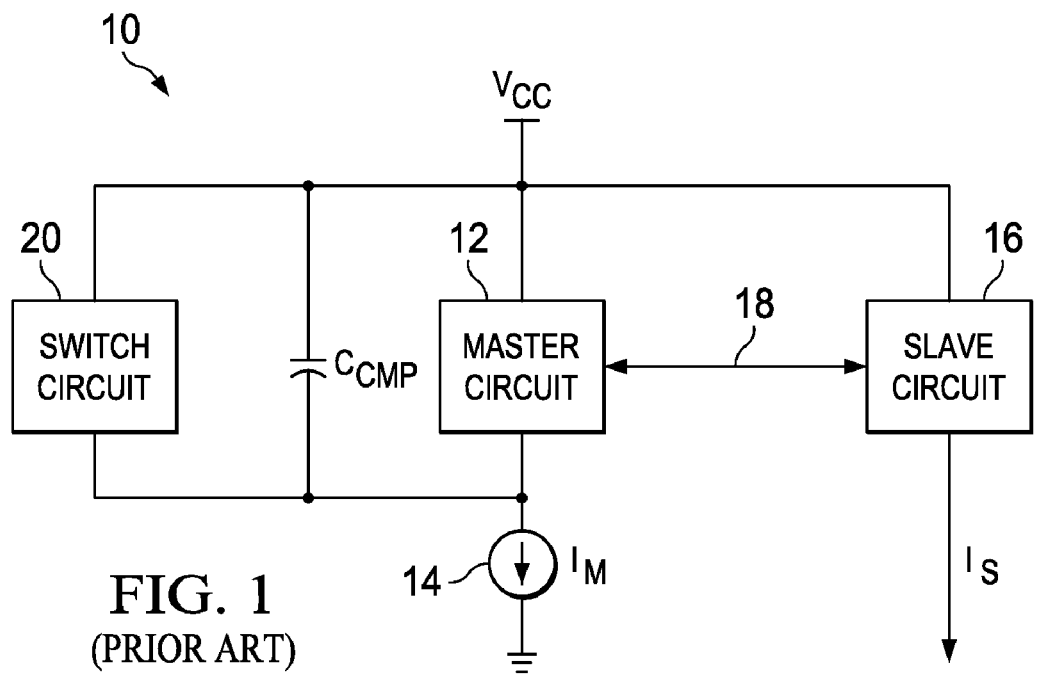
FIG. 1 illustrates an example of a typical current mirror system.
Figure 2:
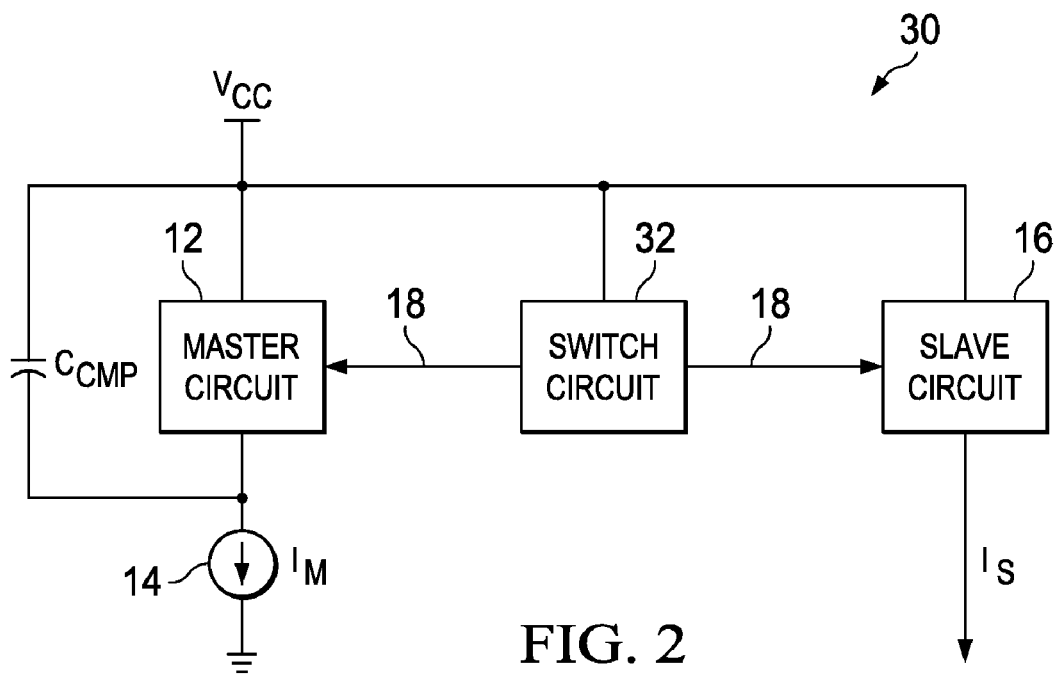
FIG. 2 illustrates another example of a typical current mirror system.
Figure 3:
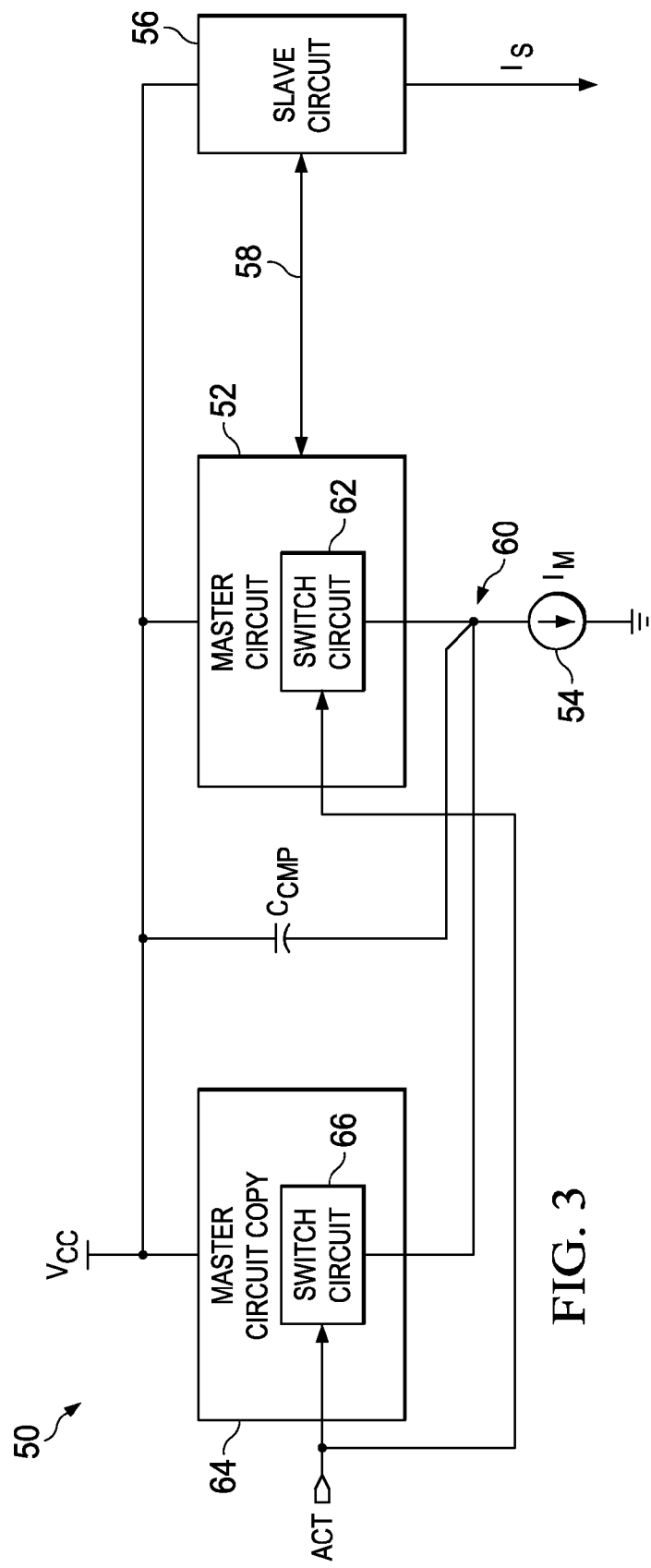
FIG. 3 illustrates an example of a current mirror system in accordance with an aspect of the invention.

FIG. 3 illustrates an example of a current mirror system 50 in accordance with an aspect of the invention. The current mirror system 50 can be implemented in any of a variety of applications to provide at least one slave current that is proportional to a master current. Furthermore, as described herein, the current mirror system 50 can also be implemented in any of a variety of applications requiring the rapid activation of one or more mirrored slave currents.

The current mirror system 50 includes a master circuit 52. As an example, the master circuit 52 can include a master transistor, such as a bipolar junction transistor (BJT), and a bias resistor that collectively provide a current path for a current $I_M$ between a positive rail voltage $V_{CC}$ and a negative rail voltage, demonstrated in the example of FIG. 3 as ground. The current $I_M$ is generated from a current source 54, such that the current $I_M$ can be controlled to have a predetermined magnitude. In the example of FIG. 3, the current source 54 provides the current $I_M$ to ground, such that the master transistor in the master circuit 52 can be configured as a PNP-type BJT. However, it is to be understood that the example of FIG. 3 is not limited to the use of PNP-type BJTS, such that the current source 54 could be configured to draw the current $I_M$ from the positive rail voltage $V_{CC}$ to provide the current to a collector of an NPN-type BJT in the master circuit 52.

The current mirror system 50 also includes a slave circuit 56. Similar to the master circuit 52, the slave circuit 56 can likewise include one or more slave transistors, such as BJTS, and a respective one or more bias resistors that each collectively provide a current path for each of the respective slave currents $I_S$. Each of the slave currents $I_S$ can have a magnitude that is equal to the master current $I_M$, or can have a magnitude that is proportional to the master current $I_M$. It is to be understood that the proportionality of each of the slave currents $I_S$ relative to the master current $I_M$ can be separate with respect to each other, such that slave currents $I_S$ can have magnitudes that are not equal with respect to each other. As an example, similar to the master circuit 52, the slave transistors of the slave circuit 56 can each be configured as PNP-type BJTS. As a result, the current paths of each of the slave currents $I_S$ can begin from the positive rail voltage $V_{CC}$, and each of the slave currents $I_S$ can be provided to any of a variety of loads.

To achieve the proportionality between the slave currents $I_S$ and the master current $I_M$, the BJTs of the master circuit 52 and the slave circuit 56 can have respective base terminals that are coupled together and are biased by a common bias voltage (e.g., a low voltage for biasing PNP-type BJTS). As such, the master circuit 52 can include one or more transistors that are configured to set the bias voltage for the respective master circuit 52 and slave circuit 56. Thus, in the example of FIG. 3, the base terminals of the respective BJTs of the master circuit 52 and the slave circuit 56 are coupled together, as demonstrated at 58.

As an example, the one or more transistors can be configured as a beta helper transistor. Specifically, the beta helper transistor can be configured in a feedback arrangement with the transistor of the master circuit 52. For example, during activation of the current mirror system 50, a collector of the transistor of the master circuit 52 can be coupled to a base of the beta helper transistor and an emitter of the beta helper transistor can be coupled to the base of the transistor of the master circuit 52 and the transistors of the slave circuit 56. As a result, the beta helper transistor can set a common bias voltage for the master circuit 52 and the slave circuit 56 for the generation of the slave currents $I_S$ proportional to the master current $I_M$.

In the example of FIG. 3, the current mirror system 50 also includes a compensation capacitor $C_{CMP}$ that is arranged in parallel with the master circuit 52 between the positive supply voltage $V_{CC}$ and a node 60. The compensation capacitor $C_{CMP}$ can be configured to stabilize the master current $I_M$, and thus the slave currents $I_S$. For example, transient effects on the master current $I_M$ can result in undesired oscillation of the master current $I_M$, and thus the slave currents $I_S$. As a result, the compensation capacitor $C_{CMP}$ is configured to substantially mitigate the transient effects and thus maintain the master current $I_M$ and respective slave currents $I_S$ as substantially constant based on an amount of charge stored therein.

In the example of FIG. 3, the current mirror system 50 is configured to receive an activation signal ACT that is configured to activate and deactivate the current mirror system 50. As an example, the activation signal ACT may be asserted (i.e., logic 1) to activate the current mirror system 50, such that the slave circuit 56 provides the slave currents $I_S$ proportional to the master current $I_M$. The activation signal ACT may be de-asserted (i.e., logic 0) to deactivate the current mirror system 50. For example, in response to the deactivation of the current mirror system 50, the slave circuit 56 can be configured to deactivate the slave currents $I_S$, such as by switching the associated transistors to a cutoff mode to reduce to the magnitude of the slave currents $I_S$ to zero.

The activation signal ACT is provided to a switch circuit 62 that is included in the master circuit 52. The switch circuit 62 is responsive to the activation signal ACT to both deactivate the beta helper transistor of the master circuit 52 and to decouple the beta helper transistor from a feedback arrangement of the beta helper transistor with the master transistor associated with the master circuit 52. Due to the deactivation of the beta helper transistor, the switch circuit 62 thus removes the bias voltage that is set by the beta helper transistor. As a result, neither the master transistor nor the slave transistors are biased. Therefore, the master current $I_M$ no longer flows through the master circuit 52, and the slave currents $I_S$ no longer flow from the slave circuit 56.

The current mirror system 50 also includes a master circuit copy 64 that is arranged in parallel with the compensation capacitor $C_{CMP}$ and the master circuit 52 between the positive rail voltage $V_{CC}$ and the node 60. The master circuit copy 64 likewise includes a switch circuit 66 that is configured to receive the activation signal ACT to activate the master circuit copy 64 in response to deactivating the master circuit 52 and the slave circuit 56. Specifically, because the switch circuit 62 is configured to remove the bias voltage set by the beta helper transistor, the master current $I_M$ no longer flows through the master circuit 52. Because the master current $I_M$ still flows to ground via the current source 54, the master circuit copy 64 thus provides an alternate current path for the master current $I_M$ upon being activated by the switch circuit 66. As such, the activation signal ACT is configured to switch the current path for the master current $I_M$ from the master circuit 52 to the master circuit copy 64 upon deactivating the current mirror system 50.

The master circuit copy 64 can be configured as a substantial copy of the master circuit 52, and the switch circuit 66 can be activated and deactivated based on opposite states of the activation signal ACT relative to the switch circuit 62. Specifically, the master circuit copy 64 can include a transistor and resistor that form a current path for the master current $I_M$, and can include a beta helper transistor that is configured in a feedback arrangement with the transistor. The switch circuit 66 can be configured to deactivate the beta helper transistor and to decouple the beta helper transistor from the feedback arrangement with the transistor upon activation of the current mirror system 50, such that the activation signal ACT activates the master circuit 52 and the master circuit copy 64 mutually exclusively.

The electronic devices of the master circuit copy 64 can be matched with the like electronic devices of the master circuit 52. Specifically, the electronic devices of master circuit copy 64 and the master circuit 52 can be fabricated together on the same region of the same semiconductor wafer, such that the matched electronic devices have substantially identical electrical properties independent of process and temperature variations. As a result, upon a transition of the current path of the master current $I_M$ between the master circuit 52 and the master circuit copy 64, the voltage at the node 60 remains substantially constant. Therefore, upon activating the current mirror system 50 in response to the activation signal ACT, such that the current path of the master current $I_M$ is switched from the master circuit copy 64 to the master circuit 52, the compensation capacitor $C_{CMP}$ does not slew its charge due to the substantially constant voltage at the node 60 upon activation of the current mirror system 50. Accordingly, the current mirror system 50 can be rapidly activated to provide the slave currents $I_S$ based on the master current $I_M$. Furthermore, because there is substantially no activation delay of the current mirror system 50 resulting from slew of the charge of the compensation capacitor $C_{CMP}$, a larger sized compensation capacitor $C_{CMP}$ can be implemented in the current mirror system 50 to provide a greater stabilization of the master current $I_M$ without affecting the activation time of the current mirror system 50.

Figure 4:
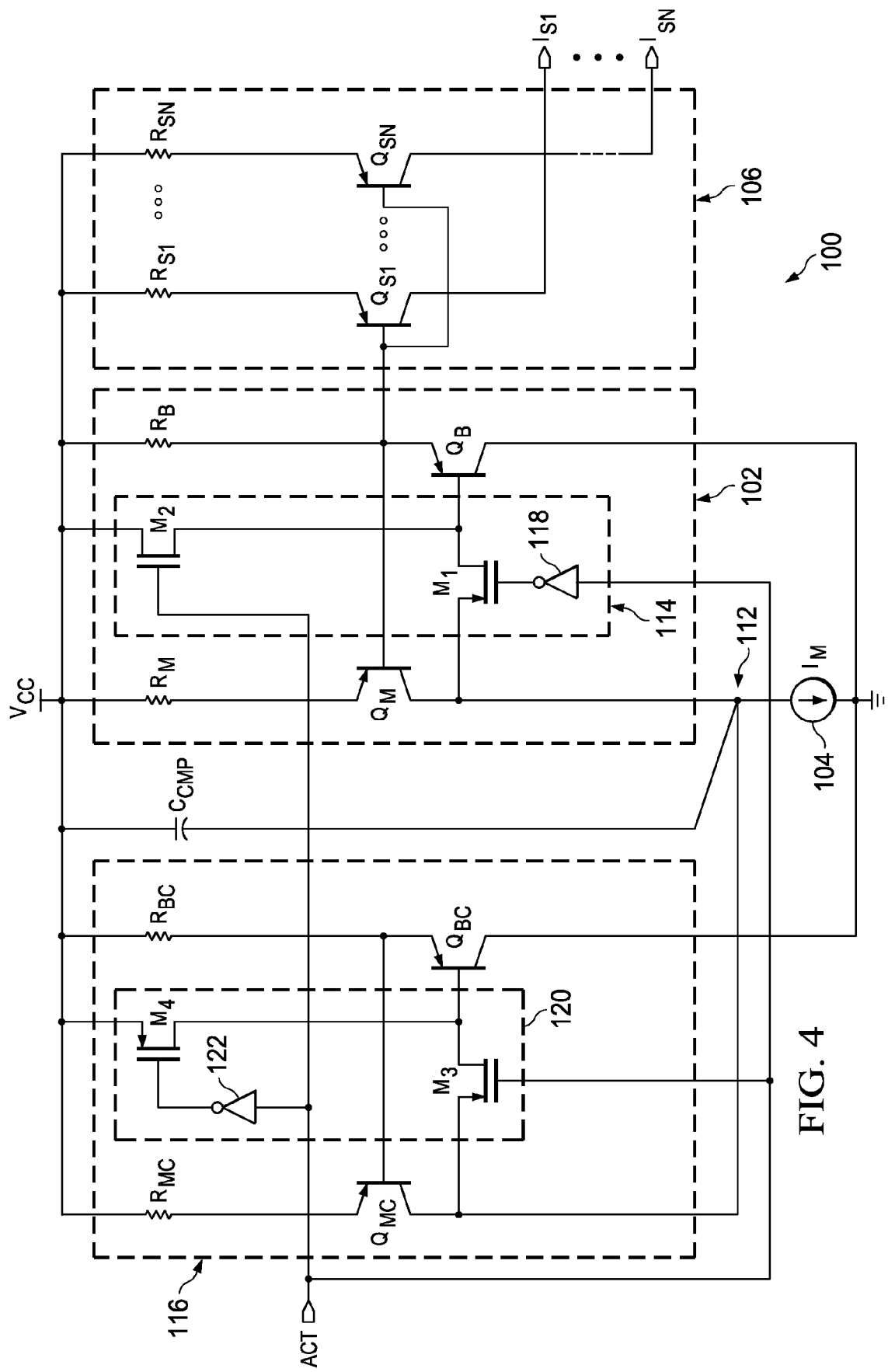
FIG. 4 illustrates another example of a current mirror system in accordance with an aspect of the invention.

FIG. 4 illustrates another example of a current mirror system 100 in accordance with an aspect of the invention. The current mirror system 100 includes a master circuit 102. The master circuit 102 includes a master transistor $Q_M$, demonstrated as a PNP-type BJT in the example of FIG. 4, and a resistor $R_M$. The master transistor $Q_M$ and the resistor $R_M$ collectively provide a current path for a current $I_M$ between a positive rail voltage $V_{CC}$ and a negative rail voltage, demonstrated in the example of FIG. 4 as ground. The current $I_M$ is generated from a current source 104, such that the current $I_M$ can be controlled to have a predetermined magnitude. Therefore, the current $I_M$ flows from the positive rail voltage $V_{CC}$ through the resistor $R_M$ and the master transistor $Q_M$ to ground.

The current mirror system 100 also includes a slave circuit 106. The slave circuit 106 includes a plurality N of PNP-type BJTs and resistors, demonstrated in the example of FIG. 4 as $Q_{S1}$ through $Q_{SN}$ and $R_{S1}$ through $R_{SN}$, respectively, where N is a positive integer. Each of the transistors $Q_{S1}$ through $Q_{SN}$ and the respective resistors $R_{S1}$ through $R_{SN}$ collectively provide a current path for each of a respective plurality of slave currents $I_{S1}$ through $I_{SN}$. Each of the slave currents $I_{S1}$ through $I_{SN}$ can have a magnitude that is equal to the master current $I_M$, or can have a magnitude that is proportional to the master current $I_M$. As an example, one or more of the transistors $Q_{S1}$ through $Q_{SN}$ can have a size (i.e., W/L ratio) that is approximately equal to the master transistor $Q_M$, such that the respective one or more slave currents $I_{S1}$ through $I_{SN}$ is approximately equal to the master current $I_M$. As another example, the proportion of a respective one or more of the slave currents $I_{S1}$ through $I_{SN}$ relative to the master current $I_M$ can be determined by varying the size of the respective one or more of the transistors $Q_{S1}$ through $Q_{SN}$ relative to the master transistor $Q_M$. As such, one or more of the slave currents $I_{S1}$ through $I_{SN}$ can be greater than or less than the master current $I_M$.

The master circuit 102 also includes a beta helper transistor $Q_B$. To achieve the proportionality between the slave currents $I_{S1}$ through $I_{SN}$ and the master current $I_M$, the transistors $Q_M$ and $Q_{S1}$ through $Q_{SN}$ are biased by a common bias voltage based on having respective base terminals that are coupled together at a node 110. The bias voltage is set at the node 110 based on the beta helper transistor $Q_B$, through which current is provided based on a resistor $R_B$. The beta helper transistor $Q_B$ is configured to have an emitter coupled to the node 110 and a collector coupled to ground, such that current flows through the beta helper transistor $Q_B$ from the positive rail voltage $V_{CC}$ to ground. The beta helper transistor $Q_B$ also has a base that is coupled to a collector of the master transistor $Q_M$ via a first switch $M_1$, and is thus configured in a feedback arrangement with the master transistor $Q_M$. As a result, the beta helper transistor $Q_B$ is configured to set the common bias voltage for the master transistor $Q_M$ and the slave transistors $Q_{S1}$ through $Q_{SN}$ for the generation of the slave currents $I_{S1}$ through $I_{SN}$ proportional to the master current $I_M$.

In the example of FIG. 4, the current mirror system 100 also includes a compensation capacitor $C_{CMP}$ that is arranged in parallel with the master circuit 102 between the positive rail voltage $V_{CC}$ and a node 112. The compensation capacitor $C_{CMP}$ can be configured to stabilize the master current $I_M$, and thus the slave currents $I_{S1}$ through $I_{SN}$. For example, transient effects on the master current $I_M$ can result in undesired oscillation of the master current $I_M$, and thus the slave currents $I_{S1}$ through $I_{SN}$. As a result, the compensation capacitor $C_{CMP}$ is configured to substantially mitigate the transient effects and thus maintain the master current $I_M$ and respective slave currents $I_{S1}$ through $I_{SN}$ as substantially constant based on an amount of charge stored therein.

The current mirror system 100 is activated and deactivated based on an activation signal ACT. To effectuate a rapid activation, the master circuit 102 includes a switch circuit 114 and the current mirror system 100 includes a master circuit copy 116. The switch circuit 114 includes a first switch $M_1$ and a second switch $M_2$, demonstrated in the example of FIG. 4 as P-type field effect transistors (FETs). As described above, the first switch $M_1$ is coupled to the collector of the master transistor $Q_M$ (i.e., the node 112) at a source and to the base of the beta helper transistor $Q_B$ at a drain. The second switch $M_2$ is coupled to the positive rail voltage Vcc at a source and the base of the beta helper transistor $Q_B$ at a drain.

Upon the activation signal ACT being asserted, the second switch $M_2$ is deactivated to separate the base of the beta helper transistor $Q_B$ from the positive rail voltage $V_{CC}$, and the first switch $M_1$ is activated via an inverter 118 to couple the base of the beta helper transistor $Q_B$ to the collector of the master transistor $Q_M$. As a result, the beta helper transistor $Q_B$ and the master transistor $Q_M$ become configured in the feedback arrangement and the beta helper transistor $Q_B$ becomes activated to conduct current. Accordingly, the beta helper transistor $Q_B$ sets the bias voltage at the node 110. Upon the activation signal ACT being de-asserted, the second switch $M_2$ is activated to couple the base of the beta helper transistor $Q_B$ to the positive rail voltage $V_{CC}$, and the first switch $M_1$ is deactivated to decouple the base of the beta helper transistor $Q_B$ from the collector of the master transistor $Q_M$. As a result, the beta helper transistor $Q_B$ becomes deactivated to remove the bias voltage (i.e., setting the bias voltage to approximately $V_{CC}$), and the feedback arrangement between the master transistor $Q_M$ and the beta helper transistor $Q_B$ is broken. Accordingly, the master transistor $Q_M$ and the slave transistors $Q_{S1}$ through $Q_{SN}$ become deactivated, such that the master current $I_M$ no longer flows through the master transistor $Q_M$ and is no longer mirrored as the slave currents $I_{S1}$ through $I_{SN}$.

The master circuit copy 116 is arranged in parallel with the compensation capacitor $C_{CMP}$ and the master circuit 102 between the positive rail voltage $V_{CC}$ and the node 112. The master circuit copy 116 includes a transistor $Q_{MC}$ and a resistor $R_{MC}$ that are interconnected between the positive rail voltage $V_{CC}$ and the node 110. The master circuit copy 116 also includes a transistor $Q_{BC}$ and a resistor $R_{BC}$. The transistor $Q_{BC}$ is configured to have an emitter coupled to the node 110 and a collector coupled to ground, such that current flows through the transistor $Q_{BC}$ from the positive rail voltage $V_{CC}$ to ground. The transistor $Q_{BC}$ also has a base that is coupled to a collector of the transistor $Q_{MC}$ via a third switch $M_3$, and is thus configured in a feedback arrangement with the transistor $Q_{MC}$. A fourth switch $M_4$ is coupled to the positive rail voltage $V_{CC}$ via a source and to the base of the transistor $Q_{BC}$ via a drain. The activation signal ACT is provided to a gate of the third switch $M_3$ and to a gate of the fourth switch $M_4$ via an inverter 122.

As demonstrated in the example of FIG. 4, the master circuit copy 116 is configured as a current path circuit that is a substantial copy of the master circuit 102, and likewise includes a switch circuit 120. Specifically, the transistor $Q_{MC}$ and the resistor $R_{MC}$ correspond to the master transistor $Q_M$ and the resistor $R_M$, respectively, of the master circuit 102. Likewise, the transistor $Q_{BC}$ and the resistor $R_{BC}$ correspond, respectively, to the beta helper transistor $Q_B$ and the resistor $R_B$. The third switch $M_3$ and the fourth switch $M_4$ correspond, respectively, to the first switch $M_1$ and the second switch $M_2$. However, the third switch $M_3$ and the fourth switch $M_4$ are activated at opposite states of the activation signal ACT relative to the first switch $M_1$ and the second switch $M_2$. Therefore, the activation signal ACT activates the beta helper transistor $Q_B$ to set the bias voltage for the master transistor $Q_M$ and deactivates the transistor $Q_{BC}$ to remove the bias voltage for the transistor $Q_{MC}$ at one state corresponding to activation of the current mirror system 100. Likewise, the activation signal ACT deactivates the beta helper transistor $Q_B$ to remove the bias voltage from the master transistor $Q_M$ and activates the transistor $Q_{BC}$ to set the bias voltage for the transistor $Q_{MC}$ at an alternate state corresponding to deactivation of the current mirror system 100. As a result, the master circuit copy 116 provides an alternate current path for the master current $I_M$ during deactivation of the current mirror system 100.

The corresponding electronic devices of each of the master circuit copy 116 and the master circuit 102 can be matched devices. Specifically, the transistors $Q_M$ and $Q_{MC}$, the transistors $Q_B$ and $Q_{BC}$, the resistors $R_M$ and $R_{MC}$, the resistors $R_B$ and $R_{BC}$, the switches $M_1$ and $M_3$, and the switches $M_2$ and $M_4$ can all be matched device pairs. As such, the matched device pairs can be fabricated together on the same region of the same semiconductor wafer, such that the matched electronic devices have substantially identical electrical properties independent of process and temperature variations. As a result, upon a transition of the current path of the master current $I_M$ between the master circuit 102 and the master circuit copy 116, the voltage at the node 112 remains substantially constant. Therefore, upon activating the current mirror system 100 in response to the activation signal ACT, such that the current path of the master current $I_M$ is switched from the master circuit copy 116 to the master circuit 102, the compensation capacitor $C_{CMP}$ does not slew its charge due to the substantially constant voltage at the node 112 upon activation of the current mirror system 100. Accordingly, the current mirror system 100 can be rapidly activated to provide the slave currents $I_{S1}$ through $I_{SN}$ based on the master current $I_M$. Furthermore, similar to as described above in the example of FIG. 3, the master current $I_M$ can benefit from greater stabilization by providing a larger compensation capacitor $C_{CMP}$ without detrimentally affecting the activation time of the current mirror system 100.

It is to be understood that the current mirror system 100 is not intended to be limited to the example of FIG. 4. As an example, although the example of FIG. 4 demonstrates the use of PNP-type BJTs and P-type FETs, the current mirror system 100 could instead be configured to include NPN-type BJTs and N-type FETs. As another example, the current mirror system 100 could implement the current mirroring function of the master circuit 102 and the slave circuit 106 using FETs instead of BJTs. Furthermore, it is to be understood that other circuit techniques can be realized and implemented for maintaining the substantially constant voltage at the node 112 at activation and deactivation transitions of the current mirror system 100. Specifically, it is to be understood that other techniques aside from implementing the master circuit copy 116 as a substantially copy of the master circuit 102 that can be implemented to maintain the charge across the compensation capacitor $C_{CMP}$ upon activation of the current mirror system 100 to provide a rapid activation of the current mirror system 100. As a result, the current mirror system can be configured in any of a variety of ways.

Figure 5:
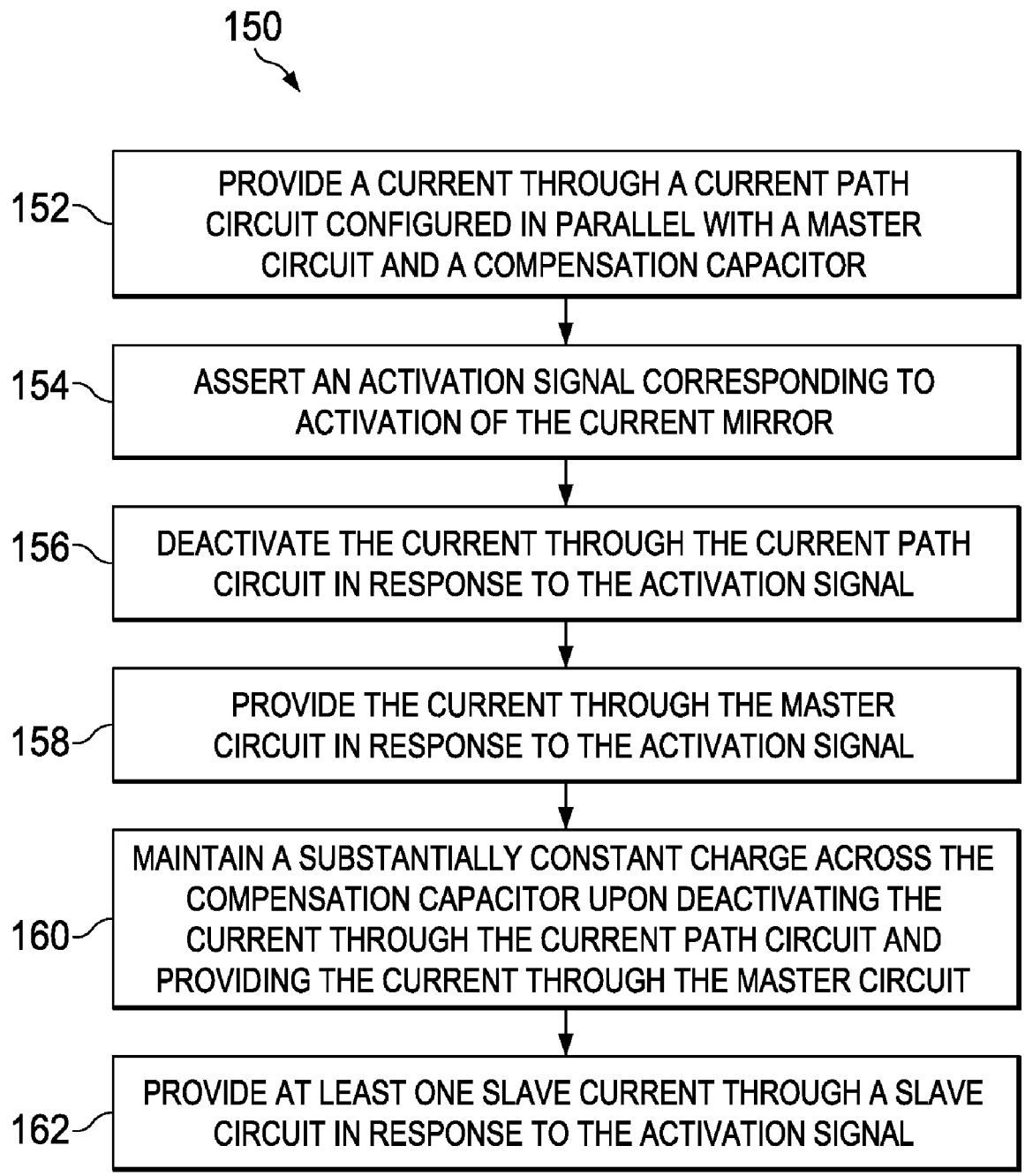
FIG. 5 illustrates an example of a method for activating a current mirror in accordance with an aspect of the invention.

In view of the foregoing structural and functional features described above, certain methods will be better appreciated with reference to FIG. 5. It is to be understood and appreciated that the illustrated actions, in other embodiments, may occur in different orders and/or concurrently with other actions. Moreover, not all illustrated features may be required to implement a method.

FIG. 5 illustrates an example of a method 150 for activating a current mirror in accordance with an aspect of the invention. At 152, a current is provided through a current path circuit that is configured in parallel with a master circuit and a compensation capacitor. The current path circuit can provide the current path during deactivated states of the current mirror. The current path could include a transistor and a resistor, with a beta helper transistor being configured in a feedback manner with the transistor.

At 154, an activation signal corresponding to activation of the current mirror is asserted. At 156, the current through the current path circuit is deactivated in response to the activation signal. The deactivation can be based on removing the bias voltage from the transistor in the current path by decoupling the feedback arrangement and by deactivating the beta helper transistor and by setting the base of the beta helper transistor to a non-bias voltage. At 158, the current is provided through the master circuit in response to the activation signal. The current path circuit can be configured as a substantial copy of the master circuit that is activated and deactivated at opposite states of the activation signal relative to the master circuit. Therefore, the activation can be based on setting a bias voltage for a transistor in the current path of the master circuit by coupling a feedback arrangement between a bias compensation transistor and the transistor in the current path and by activating the beta helper transistor and by decoupling the base of the beta helper transistor from a non-bias voltage.

At 160, a substantially constant charge is maintained on the compensation capacitor upon deactivating the current from the current path circuit and providing the current through the master circuit. The electronic devices in the current path circuit can be matched to corresponding devices in the master circuit. As a result, the matched devices can exhibit substantially identical electrical characteristics independent of process and temperature variations. Therefore, the voltage across the compensation capacitor, and thus the charge across the compensation capacitor, remain substantially constant during the activation transition of the current mirror. It is to be understood and appreciated that other circuit techniques aside from the current path circuit being a copy of the master circuit can be implemented to maintain the substantially constant charge across the compensation capacitor. At 162, at least one slave current is provided through a slave circuit of the current mirror in response to the activation signal. The provision of the master current can initiate the current mirror to provide the slave currents based on setting the bias voltage for transistors in the slave circuit. The slave currents can be proportional to the current through the master circuit. Because the charge on the compensation capacitor remains constant, there is no slew upon activation of the current mirror, resulting in a rapid activation. In addition, because the slave circuit is activated based on setting the bias voltage upon activating the beta helper capacitor, thus mitigating an RC activation delay of the transistors in the slave circuit.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A current mirror system comprising:
    a master circuit configured to conduct a first current in response to an activation state of an activation signal;
    a slave circuit configured to generate at least one second additional current in response to the activation state of the activation signal, each of the at least one additional current being proportional to the first current; and
    a current path circuit that is configured as a substantial copy of the master circuit, the current path circuit being configured to conduct the first current in response to a deactivation state of the activation signal.

2. The system of claim 1, wherein the master circuit comprises a switch circuit that is switched to set a bias voltage to activate a master transistor of the master circuit to conduct the first current in response to the activation state of the activation signal, and to remove the bias voltage to deactivate the master transistor in response to the deactivation state of the activation signal.

3. The system of claim 2, wherein the master circuit comprises a beta helper transistor coupled in a feedback arrangement with the master transistor, the beta helper transistor being activated to set the bias voltage to activate the master transistor and at least one additional transistor associated with the slave circuit in response to the activation state of the activation signal.

4. The system of claim 3, wherein the switch circuit comprises a first switch configured to decouple the feedback arrangement and a second switch configured to couple a bias terminal of the beta helper transistor to a non-bias voltage in response to the deactivation state of the activation signal.

5. The system of claim 1, wherein the current path circuit comprises a switch circuit that is switched to set a bias voltage to activate a transistor of the current path circuit to conduct the first current in response to the deactivation state of the activation signal, and to remove the bias voltage to deactivate the transistor in response to the activation state of the activation signal.

6. The system of claim 5, wherein the switch circuit comprises a first switch configured to couple the transistor and a bias transistor in a feedback arrangement and a second switch configured to activate the bias transistor to set the bias voltage for the transistor in response to the deactivation state of the activation signal.

7. The system of claim 1, wherein the current path circuit comprises electronic devices that are substantially matched to like electronic devices associated with the master circuit.

8. The system of claim 1, further comprising a compensation capacitor arranged in parallel with the master circuit and the current path circuit between a positive rail voltage and a node, wherein a voltage associated with the node is substantially constant at each activation and deactivation state transition of the activation signal.

9. The system of claim 1, wherein the master circuit and the current path circuit are configured in parallel between a positive rail voltage and a node, a voltage across the master circuit during the activation state of the activation signal being approximately equal to a voltage across the current path circuit during the deactivation state of the activation signal.

10. The system of claim 1, wherein the master circuit, the slave circuit, and the bias component each comprise at least one bipolar junction transistor (BJT).

11. A method for activating a current mirror to generate at least one slave current that is proportional to a master current, the method comprising:
    providing the master current through a current path circuit that is configured in parallel with a master circuit of the current mirror and a compensation capacitor;
    asserting an activation signal corresponding to activation of the current mirror;
    deactivating the master current through the current path circuit in response to the activation signal;
    providing the master current through the master circuit in response to the activation signal;
    maintaining a substantially constant charge on the compensation capacitor upon deactivating the master current through the current path circuit and providing the master current through the master circuit; and
    providing the at least one slave current through a slave circuit of the current mirror in response to the activation signal.

12. The method of claim 11, wherein providing the master current and providing the at least one slave current comprise setting a bias voltage associated with the master circuit and the slave circuit, respectively, in response to the activation signal.

13. The method of claim 12, wherein setting the bias voltage comprises activating a beta helper transistor via at least one switch in response to the activation signal.

14. The method of claim 13, wherein maintaining the substantially constant charge comprises maintaining a substantially constant voltage across the compensation capacitor based on the current path circuit being configured as a substantial copy of the master circuit.

15. The method of claim 14, wherein the current path circuit and the master circuit each comprise electronic devices, the method further comprising fabricating the electronic devices associated with the current path circuit to be substantially matched to the respective electronic devices of the master circuit.

16. The method of claim 11, wherein providing the master current comprises coupling a beta helper transistor to a master transistor associated with the master circuit in a feedback arrangement in response to the activation signal and decoupling a bias terminal of the beta helper transistor from a non-bias voltage.

17. A current mirror system comprising:

means for setting a bias voltage;

means for providing a master current in response to the bias voltage;

means for generating at least one slave current in response to the bias voltage, each of the at least one slave current being proportional to the master current;

capacitive means for stabilizing the master current; and means for maintaining a substantially constant charge on the capacitive means for stabilizing in response to activation and deactivation of the current mirror system and deactivation of the master current.

18. The system of claim 17, wherein the means for maintaining comprises means for diverting the master current from the means for providing the master current and for conducting the master current during deactivation of the current mirror system.

19. The system of claim 17, wherein the means for maintaining is configured as a substantial copy of the means for setting the bias voltage and the means for generating the master current.

20. The system of claim 17, wherein the means for setting the bias voltage comprises means for setting the bias voltage in response to one state of an activation signal corresponding to the activation of the current mirror system and means for removing the bias voltage in response to another state of the activation signal corresponding to the deactivation of the current mirror system.

* * * * *